United States Patent
Huang

(10) Patent No.: US 8,207,876 B2
(45) Date of Patent: Jun. 26, 2012

(54) MEMORY EFFICIENT INDEXING FOR DISK-BASED COMPRESSION

(75) Inventor: An-Cheng Huang, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 13/101,474

(22) Filed: May 5, 2011

(65) Prior Publication Data

US 2011/0208747 A1 Aug. 25, 2011

Related U.S. Application Data

(63) Continuation of application No. 12/140,657, filed on Jun. 17, 2008, now Pat. No. 7,961,119, which is a continuation of application No. 11/694,355, filed on Mar. 30, 2007, now Pat. No. 7,403,137.

(51) Int. Cl.
*H03M 7/34* (2006.01)
(52) U.S. Cl. .......................................... 341/51; 341/106
(58) Field of Classification Search ............... 341/50, 341/51, 106, 67, 65; 707/2; 714/759
See application file for complete search history.

(56) References Cited

U.S. PATENT DOCUMENTS

| 5,229,768 | A | 7/1993 | Thomas |
| 5,281,967 | A | 1/1994 | Jung |
| 7,203,878 | B2 | 4/2007 | Naegle et al. |
| 7,403,137 | B1 | 7/2008 | Huang |
| 7,526,607 | B1 | 4/2009 | Singh et al. |
| 2002/0178410 | A1 | 11/2002 | Haitsma et al. |
| 2004/0085953 | A1 | 5/2004 | Davis |
| 2005/0283711 | A1 | 12/2005 | Claseman |
| 2008/0235792 | A1 | 9/2008 | Xing et al. |

OTHER PUBLICATIONS

Declaration of An-Cheng Huang with three page attachment titled "Memory-efficient Indexing for Disk-based Compression Methods on WAN Optimization Device," Sep. 15, 2007, 4 pages.
Co-pending U.S. Application No. 12/140,657, filed Jun. 17, 2008 entitled "Memory Efficient Indexing for Disk-Based Compression" by An-Cheng Huang, 38 pages.

*Primary Examiner* — Peguy Jean Pierre
(74) *Attorney, Agent, or Firm* — Harrity & Harrity, LLP

(57) ABSTRACT

A network optimization device may receive a stream of data and generate a signature for a plurality of fixed length overlapping windows of the stream of data. The device may select a predetermined number of the generated signatures for each $L_n$-byte segment of the data stream, wherein $L_n$ is greater than a length of each of the windows. The network device may store the selected signatures in a bucketed hash table that includes a linked-list of entries for each bucket.

20 Claims, 9 Drawing Sheets

MEMORY EFFICIENT INDEXING FOR DISK-BASED COMPRESSION

RELATED APPLICATIONS

This application is a continuation of U.S. patent application Ser. No. 12/140,657, filed Jun. 17, 2008, which is a continuation of U.S. patent application Ser. No. 11/694,355, filed Mar. 30, 2007 (now U.S. Pat. No. 7,403,137). Both disclosures are incorporated herein by reference.

BACKGROUND OF THE INVENTION

A. Field of the Invention

Concepts described herein relate generally to data compression, and more particularly, to a compression scheme with disk-based dictionary in a wide area network optimization device.

B. Description of Related Art

Geographically distributed entities, such as a business with multiple local offices in different locations, frequently desire to maintain a logically unified proprietary network that is accessible by all of the geographically distributed entities. To accomplish this, a wide area network (WAN) may be used to link the different locations.

Information technology managers within geographically distributed entities face the conflicting requirements of keeping costs in check while providing users with new and faster applications. This conflict is most acute on the WAN, where costs can be high and getting applications to perform well is hampered by limited bandwidth and high latency.

Solutions are known to help improve performance over the WAN portion of a network. These solutions may be based on a number of technologies, including data compression, data prefetching and caching, application-specific acceleration, and policy-based bandwidth allocation.

Data caching and compression, in particular, can be used to reduce the perceived latency (response time) of data accesses over a WAN. Compression and caching techniques may be disk-based, as opposed to semiconductor memory based, due to orders-of-magnitude larger storage capacity of typical hard disk drives.

Compression techniques using disk-based dictionary can be particularly effective in compressing large file transfers. With this type of compression technique, data may be stored on disk drives at compression devices at opposite ends of the WAN. When a block of data that has been previously sent is again received by the compression device, the compression device does not need to send the actual block of data. Instead, it may simply send a reference to the block of data to the device on the other end of the WAN.

In order to perform dictionary-based compression efficiently, some form of index is usually constructed and maintained by the compression devices. Efficiently constructing and using such an index can be important to maximizing the effectiveness of the compression device.

SUMMARY

One aspect is directed to a method comprising receiving a stream of data; generating a signature for a plurality of fixed length overlapping windows of the stream of data; selecting a predetermined number of the generated signatures for each $L_n$ length segment of the data stream, wherein $L_n$ is greater than the length of each of the windows; and storing the selected signatures in a bucketed hash table that includes a linked-list of entries in each bucket of the hash table.

Another aspect is directed to a network device. The network device may include one or more disk drives and logic to store data to the one or more disk drives. The network device maintains a lookup table that stores signatures that are used to determine when a block of data has been previously processed by the network device and compress the block of data when the data is transmitted over a network. The lookup table may include a bucketed hash table where each bucket in the hash table is structured as a linked-list of entries and corresponds to an index of the hash table, each of the entries including a signature of a block of data and an identifier indicating where on the one or more disk drives the block of data is stored.

Yet another aspect is directed to a method performed in a first network device. The method may include generating a signature for a block of data in a data stream; matching the generated signature to signatures stored in a bucketed hash table in which hash table collisions are stored in a linked-list structure, the matching including comparing the signature to a plurality of previously stored signatures in a bucket of the hash table that corresponds to the generated signature; matching the block of data to a previously stored block of data when a match of the signature is detected in the bucketed hash table; and transmitting a reference to the block of data to a second network device when a match is detected in the bucketed hash table and the block of data is matched to the previously stored block of data.

BRIEF DESCRIPTION OF THE DRAWINGS

The accompanying drawings, which are incorporated in and constitute a part of this specification, illustrate one or more embodiments of the invention and, together with the description, explain the invention. In the drawings.

DETAILED DESCRIPTION

The following detailed description of the invention refers to the accompanying drawings. The same reference numbers in different drawings may identify the same or similar elements. Also, the following detailed description does not limit the invention. Instead, the scope of the invention is defined by the appended claims and equivalents.

As described herein, a network optimization device may operate to increase application performance over a wide area network. The network optimization device may use disk-based compression to achieve the performance increase. The disk-based compression may be performed using an efficient indexing scheme.

Exemplary System Overview

Figure 1:
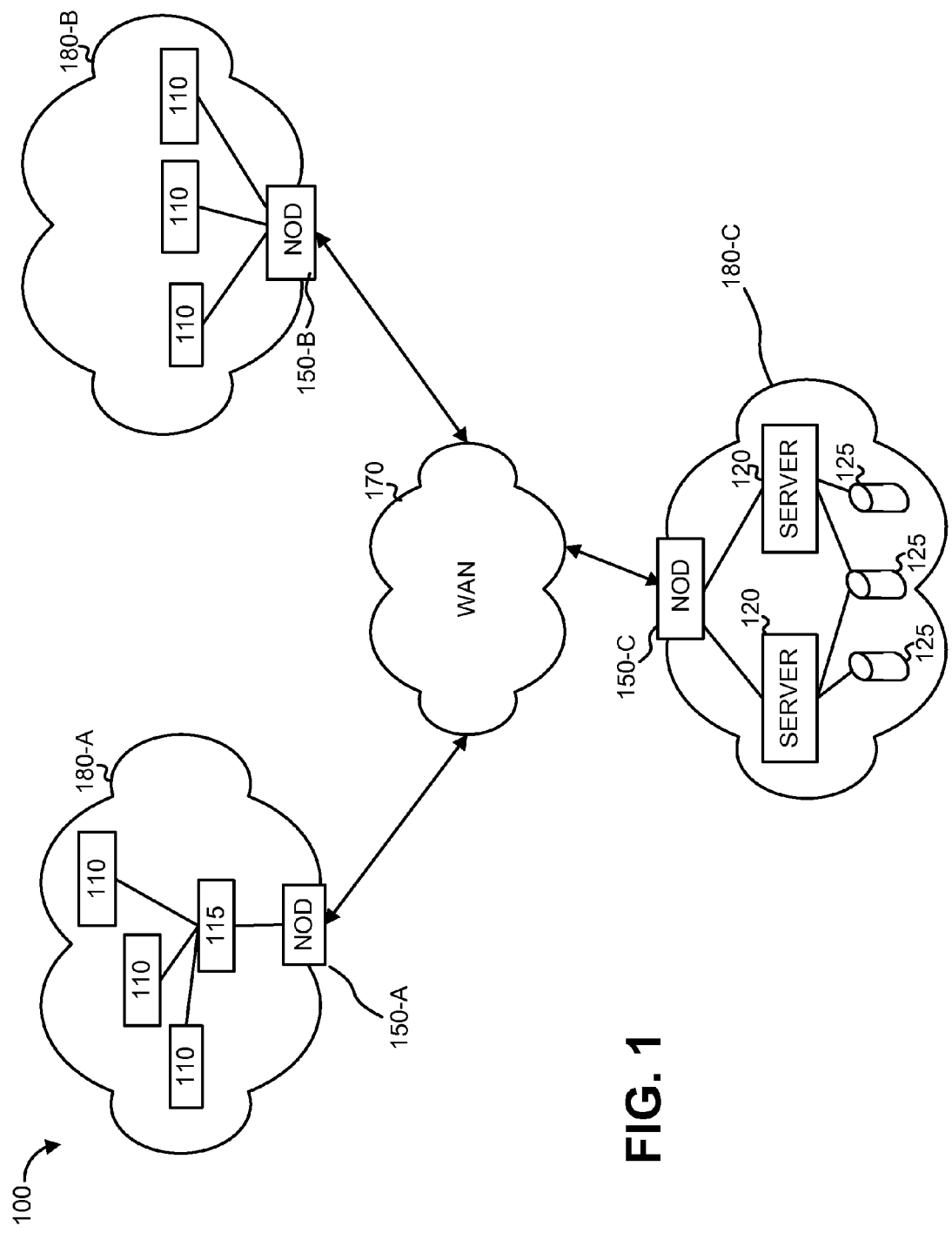
FIG. 1 is a diagram of an exemplary system.

FIG. 1 is a diagram of an exemplary system 100. System 100 may include a wide area network (WAN) 170 and one or more private networks 180-A, 180-B, and 180-C (collectively referred to as private networks 180). Private networks 180 may be geographically dispersed and different ones of private networks 180 may wish to communicate with one another over WAN 170. Private networks 180 may each, for example, be a local area network (LAN) for a branch office associated with a corporation or other entity. As another example, private networks 180-A and 180-B may be LANs for a corporate branch office and private network 180-C may be a data center for the corporation.

WAN 170 may include a public network, such as the Internet. In some implementations, WAN 170 may be implemented by privately owned or leased data lines between private networks 180, or by a combination of a public network and privately owned or leased data lines. In general, data traffic between private networks 180 through WAN 170 may be characterized by one or more of increased cost, higher latency, or lower bandwidth than data traffic within a single corporate network 180. Accordingly, network applications accessing resources between private networks 180 and across WAN 170 may tend to run less optimally than an application running locally at a private network 180.

Private networks 180 may each include a number of computing devices, such as, for example, client computing stations 110, network security device(s) 115, servers 120, and databases 125. Client computing stations 110 may include computing devices of end-users, such as desktop computers or laptops. Network security devices 115 may include, for example, firewalls or other devices relating to network security. Servers 120 may include one or more devices designed to interact with and deliver information to other devices, such as client computing stations 110. Servers 120 may, for example, serve data files or network applications to computing stations 110 over WAN 170. Servers 120 may interact with databases 125 when providing information to client computing stations 110.

In the exemplary system shown in FIG. 1, private networks 180-A and 180-B may be branch offices that include a number of client computing stations 110 and private network 180-C may function as a data center that includes a number of servers 120, which may include file servers for private networks 180-A and 180-B. One of ordinary skill in the art will recognize that the number of private networks shown in FIG. 1 (three), the elements associated with each private network and/or the functionality of each private network is exemplary.

Private networks may be associated with network optimization devices (NODs) 150-A through 150-C (collectively referred to as network optimization devices 150). As shown in FIG. 1, for example, each of private networks 180-A through 180-C is associated with a corresponding network optimization device 150-A, 150-B, and 150-C, respectively. Network optimization devices 150 may generally operate to enhance the performance of applications running over WAN 170 between various ones of private networks 180. For example, assume that a user at one of client computing stations 110 at private network 180-A would like to retrieve a file from a file server at private network 180-C. In this situation, network optimization devices 150-A and 150-C may operate to decrease the perceived latency and/or increase the perceived bandwidth of WAN 170 by providing, for example, data compression and data caching services over WAN 170. Aspects of network optimization devices 150 as they relate to disk-based data compression will be particularly described in more detail herein.

Exemplary Device Architecture

Figure 2:
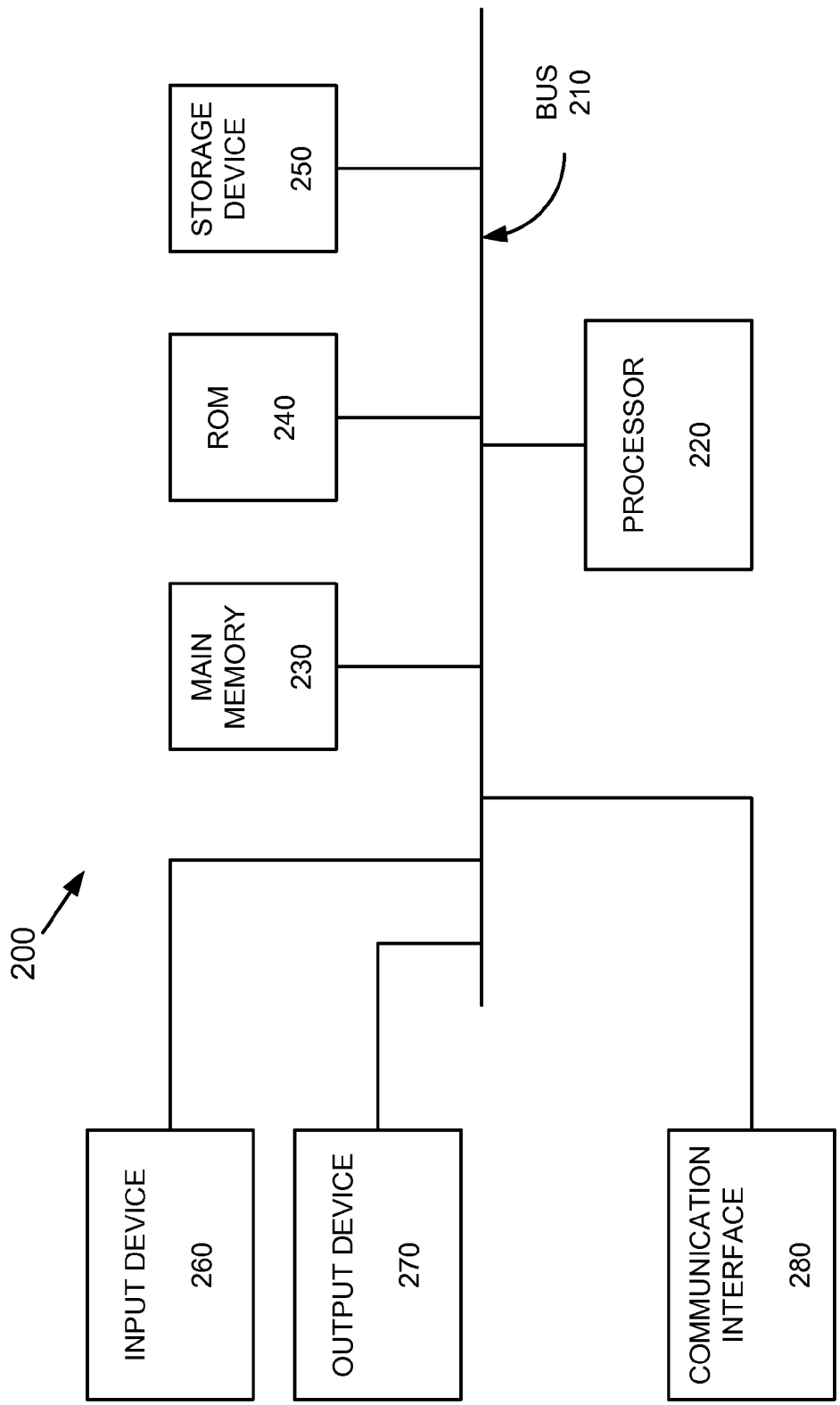
FIG. 2 is a block diagram of an exemplary device shown in FIG. 1.

FIG. 2 is a block diagram of an exemplary device 200, which may correspond to one or more of client computing stations 110, network security device 115, a server 120, a database 125, or a network optimization device 150. Device 200 may include bus 210, processor 220, main memory 230, read only memory (ROM) 240, storage device 250, input device 260, output device 270, and communication interface 280. Bus 210 may include a path that permits communication among the elements of the device.

Processor 220 may include a processor, microprocessor, or processing logic that may interpret and execute instructions. Main memory 230 may include a random access memory (RAM) or another type of dynamic storage device that may store information and instructions for execution by processor 220. ROM 240 may include a ROM device or another type of static storage device that may store static information and instructions for use by processor 220. Storage device 250 may include a magnetic storage medium such as a hard disk drive.

Input device 260 may include a mechanism that permits an operator to input information to the device, such as a keyboard, a mouse, a pen, voice recognition and/or biometric mechanisms, etc. Output device 270 may include a mechanism that outputs information to the operator, including a display, a printer, a speaker, etc. Communication interface 280 may include any transceiver-like mechanism that enables the device to communicate with other devices and/or systems.

Device 200 may perform certain operations, as described in detail below. The device may perform these operations in response to processor 220 executing software instructions contained in a computer-readable medium, such as memory 230. A computer-readable medium may be defined as a physical or logical memory device.

The software instructions may be read into memory 230 from another computer-readable medium, such as data storage device 250, or from another device via communication interface 280. The software instructions contained in memory 230 may cause processor 220 to perform processes that will be described later. Alternatively, hardwired circuitry may be used in place of or in combination with software instructions to implement processes consistent with the principles of the invention. Thus, implementations consistent with the principles of the invention are not limited to any specific combination of hardware circuitry and software.

Disk-Based Compression

Before describing the operation of network optimization devices 150 in additional detail, it will be helpful to generally describe compression over a wide area network.

Figure 3:
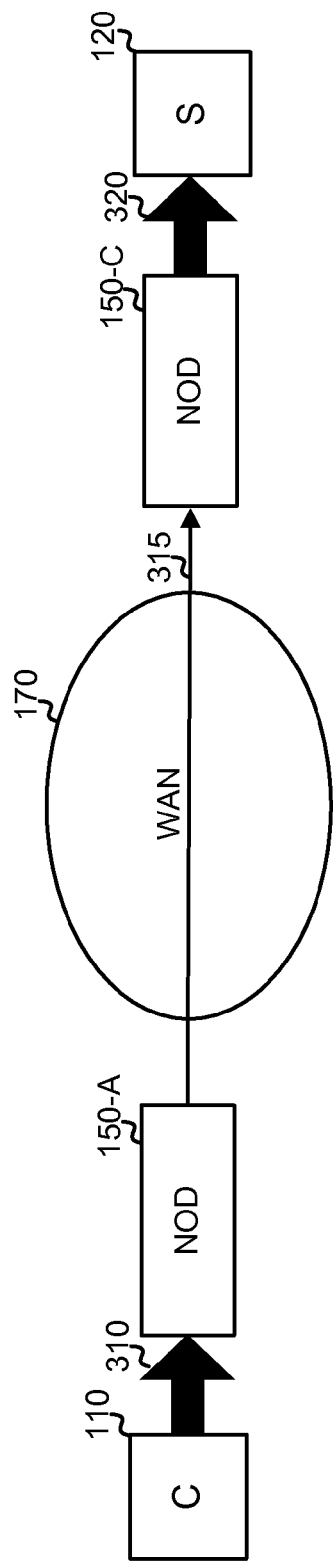
FIG. 3 is a diagram illustrating data compression over a wide area network.

FIG. 3 is a diagram illustrating data compression over a WAN to improve perceived application performance over the WAN. The data may be, for example, file data being transferred to a remote server, such as a file being transferred by a client computing station 110 to a file server 120.

Assume that client computing station 110, in private network 180-A, would like to transfer a file or a portion of a file to file server 120, in private network 180-C. The file transfer is being made across WAN 170. Network optimization devices 150-A and 150-C may operate to increase the perceived performance of file transfers for client computing station 110 by, among other things, using data compression when transferring data over WAN 170.

One form of data compression is known as symbol or dictionary based compression. With this form of data compression, pairs of network optimization devices may store patterns of data, such as patterns from previously exchanged data, as symbols in memory or on a hard disk drive. Each symbol may be associated with an identifier, such as a location on the hard disk drive. Each symbol should ideally be much longer than the corresponding identifier. When a symbol is subsequently encountered, only the identifier is sent instead of the symbol.

As an example of the operation of data compression for transmitted data, assume that client computing station 110 initiates transmission of data to file server 120, shown as arrow 310 in FIG. 3. Network optimization device 150-A may examine the data to either store new symbols or look for previously stored symbols. If network optimization device 150-A locates a previously stored symbol that is also stored at network optimization device 150-C, network optimization device 150-A may transmit the identifier for the symbol instead of the symbol to network optimization device 150-C (shown as arrow 315). Network optimization device 150-C may receive the identifier and substitute the symbol corresponding to the identifier into the data stream before transmitting the data stream to file server 120 (shown as arrow 320). In this manner, the actual data sent over WAN 170 is compressed relative to the original stream sent by client computing station 110 to file server 120.

To efficiently implement a dictionary-based compression scheme, it is desirable to be able to efficiently identify data that was previously seen or sent. In general, incoming data may be indexed to thereby allow the network optimization devices to determine when a block of data can be sent as a reference to the block of data instead of sending the actual block of data.

One existing technique for creating an index for a dictionary-based compression scheme operates on a per-data unit (e.g., a packet in a TCP/IP network) basis. In this technique, when a packet $P_i$ is received by the network optimization device 150, the data in the packet may be stored on a hard disk drive, and a "signature" (for example, a checksum) is calculated for the packet. The signature ($S_i$), the disk location ($O_i$), and the length ($L_i$) of the packet may then be entered into a lookup table that implements the index. The packet may also be sent to the corresponding network optimization device 150, which may also store the data on a hard disk drive.

Assume that after n packets ($P_1, P_2, \ldots, P_n$) have been sent between the network optimization devices, the next packet $P_{n+1}$ received by the first network optimization device is the same as $P_j$, ($1<=j<=n$), which has been previously seen by the network optimization devices. After the first network optimization device calculates $S_{n+1}$, it may use the lookup table to discover that the signature has been seen before, i.e., it is the same as $S_j$. From the lookup table, the first network optimization device may obtain $O_j$ and $L_j$, which indicate where on the disk the packet $P_j$ was stored. Instead of sending the whole packet $P_{n+1}$ to the other network optimization device, the first network optimization device can simply send the offset $O_j$ and length $L_j$. When the other network optimization device receives the offset and length, it may read the packet from its hard disk drive and send the packet to its destination.

One drawback with a packet-based scheme, such as that described above, is that the packetization of data transfer may not stay constant even when the same data is transferred repeatedly, i.e., the number and sizes of packets can be different every time. If the packetization changes, the stored data and the constructed lookup table may become useless for compression since all subsequent incoming packets will not match what has been seen previously.

Another existing technique for creating an index for a dictionary-based compression scheme operates on a stream basis in which packetization is ignored. In this technique, incoming data may be treated as a stream and written to disk continuously. A sliding "window" of a fixed length may be applied over the stream, and for each window, a hash function may be applied to obtain a signature. For example, using a sliding window of $L_d$ bytes, a signature may be calculated for bytes 0 to ($L_d$−1), bytes 1 to $L_d$, bytes 2 to ($L_d$+1), etc. To reduce the number of signatures to a manageable level, the signatures may be further sampled such that only signatures that have certain characteristics are kept, for example. Each sampled signature may then be inserted into a one-dimensional lookup table by first converting the signature to an index value. The signature and the offset on the disk corresponding to the signature may then be stored in the lookup table at the index value. In other words, the lookup table is a one-dimensional array in which succeeding signatures having the same index value overwrite previous entries in the lookup table.

One drawback with the above-described streaming technique for creating the lookup table is that index collisions (i.e., different signatures mapping to the same index value) are inevitably frequent due to the large numbers of signatures produced. For example, if the sampling mechanism on average keeps 4 signatures per 1 KB of data, than 250 GB of data may result in 1 billion signatures. If each entry in the lookup table is 12 bytes, and the size of the whole table is 2 GB, then in the best case more than 85% of the signatures will collide with existing signatures already in the lookup table. One effect of the high index collision rate is that the chance of finding an existing match becomes increasingly smaller as more data are processed (and thus more signatures are entered into the lookup table, overwriting existing ones). The result is that the compression effectiveness of this stream-based solution decreases with the "age" of the data. In other words, the technique may achieve worse compression on data that are seen further in the past. Moreover, although increasing the lookup table size can alleviate this problem, it is difficult to predict for a given history size how large the table should be. The reason is that the index collision rate depends on the actual data pattern. Another effect of the high index collision rate is that the "false positive" rate may be quite high. In other words, since most of the signatures are lost due to index collision, most of the signatures found in the incoming data packets will correspond to lookup table entries that no longer contain the original signatures. Since detecting a false positive requires actually comparing bytes in the packet to bytes on the disk, the high false positive rate may cause many unnecessary disk reads and therefore significantly lower the performance of the scheme.

Stream-Based Indexing

As will be described below, network optimization devices 150 may use a stream based indexing technique to index data for a dictionary-based compression service. The stream-based indexing technique may ignore packetization of the data but still produce a scalable and memory-efficient index.

Figure 4:
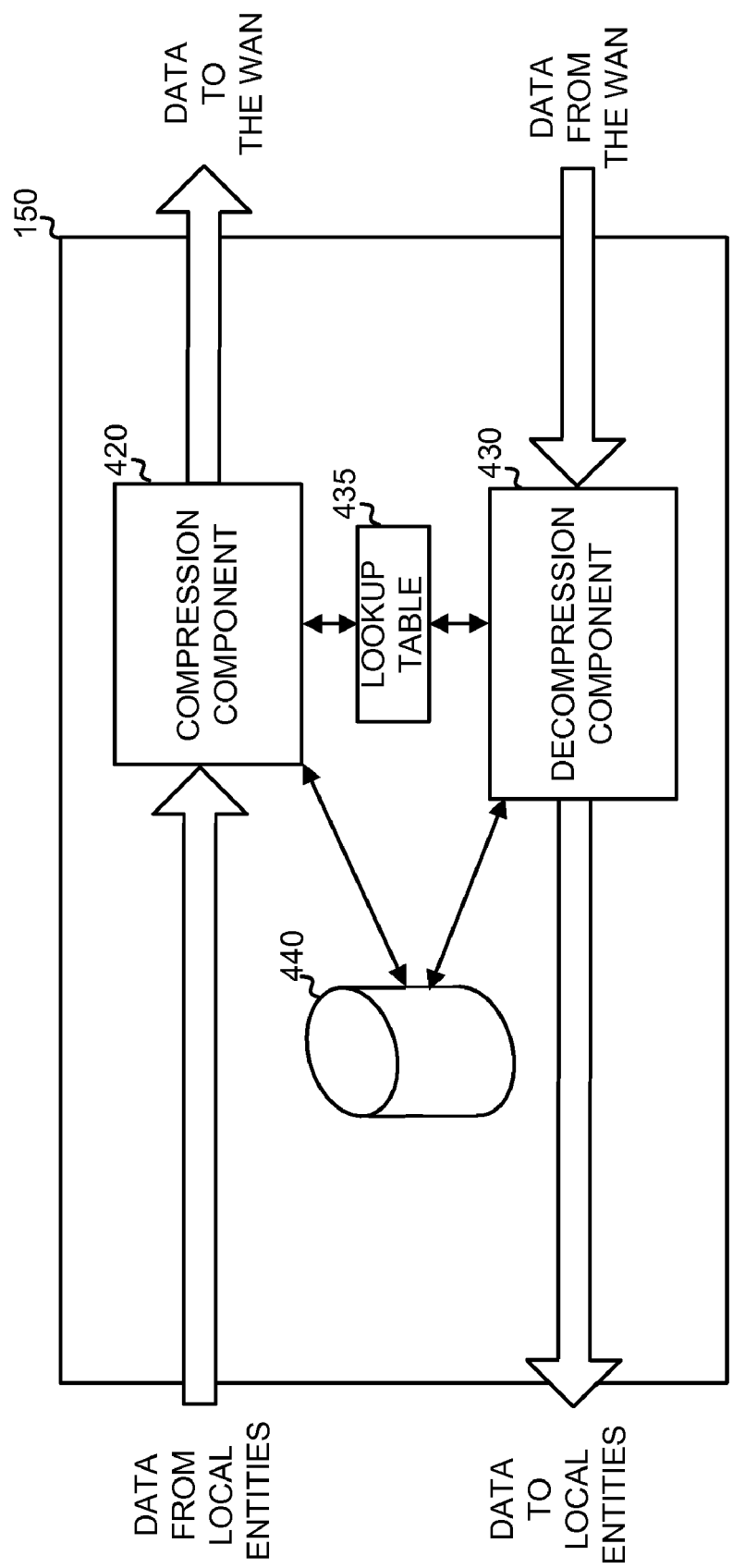
FIG. 4 is a diagram conceptually illustrating exemplary elements of a network optimization device.

FIG. 4 is a diagram conceptually illustrating exemplary elements of one of network optimization devices 150. Network optimization device 150 may include compression component 420, decompression component 430, lookup table 435, and hard disk drive 440.

Compression component 420 and decompression component 430 may perform dictionary-based compression and decompression of data for entities transferring data through network optimization device 150. An entity, as used herein, may refer to any distinguishable unit that uses network optimization device 150, such as a computer, a process, or a group of computers/processes. Although shown as a single component in FIG. 4, it can be appreciated that each of compression component 420 and decompression component 430 may be implemented using one or more physical or logical elements. Alternatively, compression component 420 and decompression component 430 may be combined as a single component.

Hard disk drive 440 may be used by compression component 420 and decompression component 430 in implementing the compression services. In one implementation, hard drive 440 may be implemented as a single hard disk drive. In alternate implementations, hard disk drive 440 may be a logical drive implemented as an aggregation or cluster of multiple hard disk drives. Hard drive 440 may store, for example, the previously received (historical) data from local or remote entities.

Lookup table 435 may include an index of the historical data seen by compression component 420 and decompression component 430. Lookup table 435 may be stored in, for example, relatively high speed memory, such as volatile random access memory. In an alternative implementation, lookup table 435 may be stored in hard drive 440.

Figure 5:
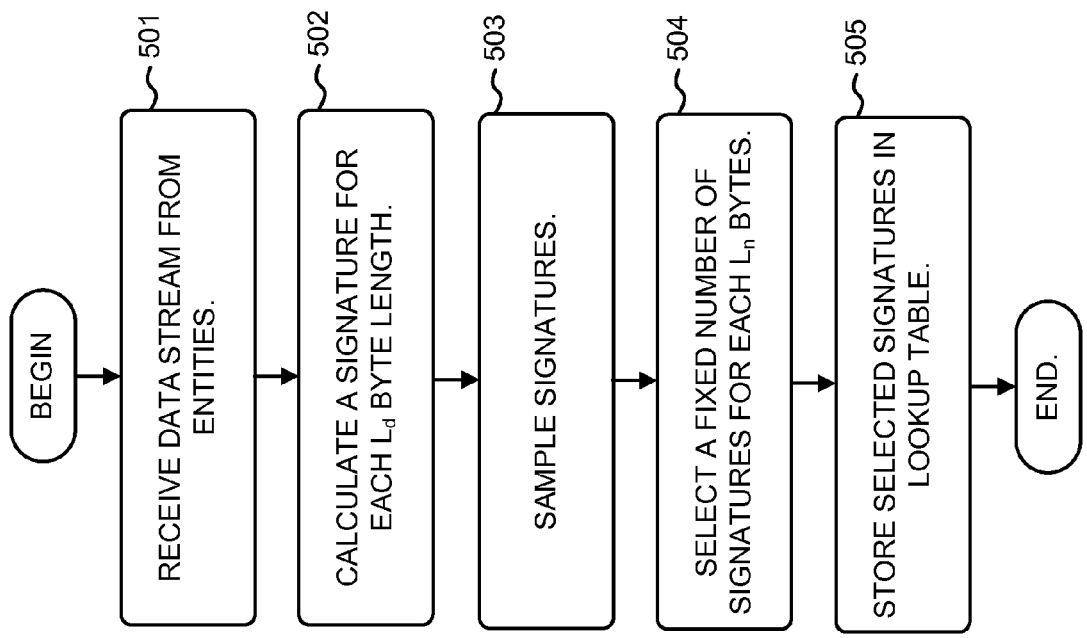
FIG. 5 is a flow chart illustrating exemplary operations for building or maintaining a lookup table.

FIG. 5 is a flow chart illustrating exemplary operations for building or maintaining a lookup table by compression component 420 of network optimization device 150. Compression component 420 may receive data, such as packets, from entities local to compression component 420 (act 501). The data received may be treated and processed by compression component 420 as a sequential stream of data.

Compression component 420 may calculate a signature for each "window" of data in the input stream of data (act 502). The signatures may be calculated, for example, for each $L_d$-byte window in the input stream (act 502). The signatures may be calculated using a sliding window in which each version of the window "slides" by one byte. That is, a signature may be calculated for bytes 0 to ($L_d$−1), bytes 1 to $L_d$, bytes 2 to ($L_d$+1), etc.

Figure 6:
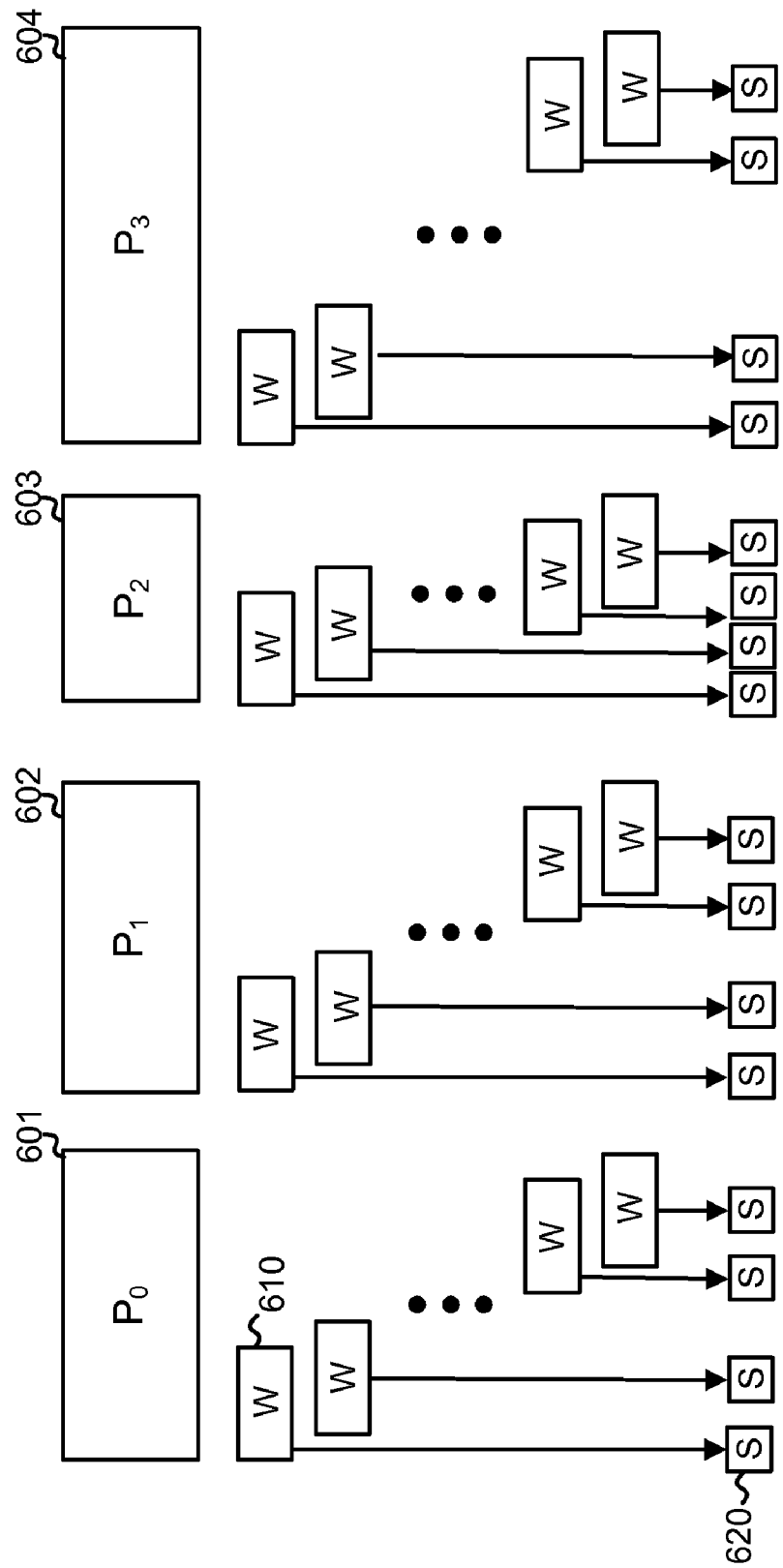
FIGS. 6 and 7 are diagrams conceptually illustrating certain of the operations shown in the flow chart of FIG. 5.
Figure 7:
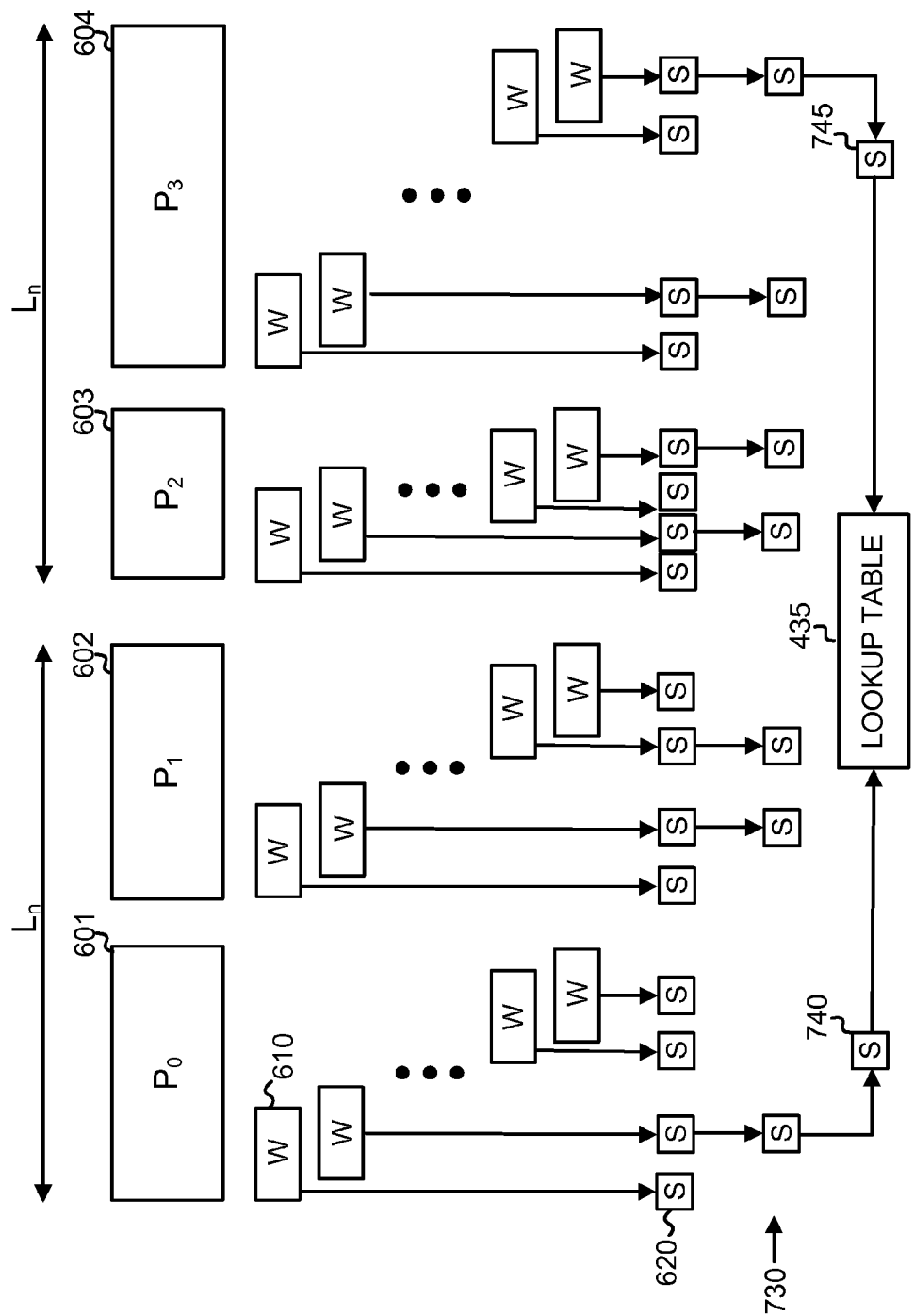

FIGS. 6 and 7 are diagrams conceptually illustrating certain of the operations shown in FIG. 5. Four packets are illustrated in FIG. 6 as being part of a data stream: packets 601, 602, 603, and 604 (labeled as packets $P_0$, $P_1$, $P_2$, and $P_3$). For each packet, a number of sliding windows ("W") 610, each of length $L_d$ bytes, may be sampled. Each window may be offset from the next window by one byte. Sliding windows 610 may be thought of as a continuous stream of windows.

For each window 610, a signature for the window may be calculated. In one implementation, the signature is a fixed length signature of length $L_s$, where $L_s$ is less than $L_d$. Stated more formally, each signature may be calculated using the function $F_S(D)=S$, where D is a data chunk of $L_d$ bytes and S is the resulting $L_s$-byte signature. For example, $F_S$ can be a hashing function that takes $L_d$ bytes of input and produces an output of $L_s$ bytes. In FIG. 6, a signature ("S") 620 for each window is shown.

Compression component 420 may "sample" the signatures to obtain a reduced number of signatures (act 503). The signatures may be reduced in number using, for example, a predetermined filter function. As an example of such a function, compression component 420 may select only the signatures whose least significant k bits have a specific value. Probabilistically, this filter, on average, may reduce the number of signatures by a factor of $2^k$.

An example of a sampled set of signatures 620 is shown in FIG. 7. In this example, seven signatures 730 remain after being sampled in act 503. Assume that the filter function selected was that the two least significant bits of signatures 620 have the value zero (i.e., a probabilistic 25% sampling). Accordingly, in this example, signatures 730 would correspond to those of signatures 620 that have a value of zero for each of the two least significant bits.

A fixed number of the sampled signatures may be selected for each $L_n$ bytes of data (act 504). In one implementation, one signature may be selected for each $L_n$ bytes of data. $L_n$ may be chosen as a value much larger than $L_d$. In the example of FIG. 7, one span of $L_n$ bytes is illustrated as including packets 601 and 602 and a second span of $L_n$, bytes is illustrated as including packets 603 and 604. Although, in this example, the $L_n$-byte spans of data were illustrated as falling on packet boundaries, the $L_n$-byte spans are applied to the data stream and therefore may not necessarily correspond to packet boundaries. That is, a packet may be "divided" by two different $L_n$-byte spans.

As is further shown in FIG. 7, one signature is selected from each of the two $L_n$-byte spans, illustrated as signatures 740 and 745. Each of the signatures selected in act 504 may be stored in lookup table 435 by compression component 420 (act 505). In this example, signatures 740 and 745 may be stored in lookup table 435.

Figure 8:
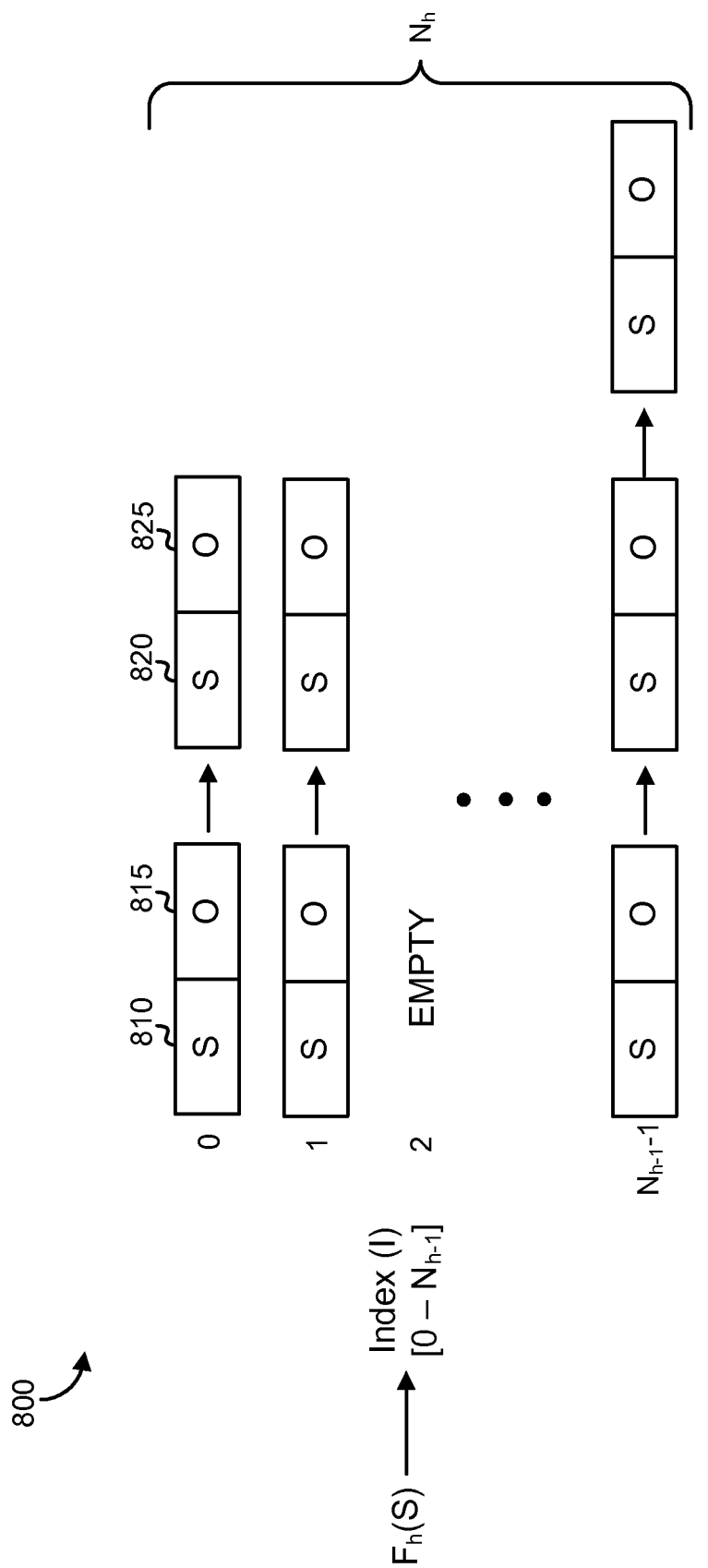
FIG. 8 is a diagram illustrating an exemplary implementation of the lookup table shown in FIG. 4.

FIG. 8 is a diagram illustrating an exemplary implementation of lookup table 435. In this implementation, lookup table 435 may be a bucketed or full hash table. As illustrated, hash table 800 may be able to store up to $N_h$ entries, indexed from 0 through $N_h$−1. A signature S that is to be entered into hash table 800 may be converted to an index value I using a conversion function, such as a suitably chosen hash function $F_h(S)$ that takes an input signature value and generates an index value I in the range 0 through $N_h$−1. Each element in hash table 800 may be thought of as a "bucket" that stores a linked list of entries. Multiple signatures that hash to the same bucket (i.e., index value) are all stored in the linked list.

In one implementation, each entry in hash table 800 may include the signature of the data and a value indicating where on the storage device the data corresponding to the signature is located. This value may be, for example, an offset pointing to the corresponding data on disk drive 440.

As an example of building hash table 800, assume that a first signature, signature 810, hashes to index zero. This signature, along with its corresponding offset 815 is stored in hash table 800 at index zero. Assume that another, different signature 820 also hashes to index zero. A hash collision has occurred. Signature 820 and its corresponding offset 825 may also be stored at index zero by chaining signature 820 and offset 825 to signature 810 and offset 815 using a pointer. Different index values, at any particular time, may have a different number of stored signature/offset pairs. As shown in FIG. 8, for instance, index zero is shown as including two chained signature/offset pairs, index one is shown as including two chained signature/offset pairs, index two is shown as being empty, and index $N_h$−1 is shown as including three chained signature/offset pairs.

As discussed with respect to act 504, a fixed number of signatures for each bytes may be stored in lookup table 435. The fixed number of signatures may be set at 1, for example. The specific signature to store may be determined based on predefined rules. As an example of such a set of rules, assume that compression component 420 calculates signatures $S_0$, $S_1$, ..., $S_j$ for an $L_n$-byte section of the input stream (acts 501-503). Which of these signatures to enter into lookup table 435 may be determined as follows:

a. Find the smallest i (0<=i<=j) such that $S_i$ is not already in lookup table 435. If such an S, exists, enter S, into the lookup table.

b. If all signatures $S_0$, $S_1$, ..., $S_j$ are already in lookup table 435, then enter $S_0$ into lookup table 435, replacing the existing signature.

It can be appreciated that the above description for building lookup table 435 may be modified in a number of ways. For example, although sampling signatures in act 503 and selecting a fixed number of signatures in act 504 are described as two separate operations, it can be appreciated that these operations may be performed together as a single operation.

Figure 9:
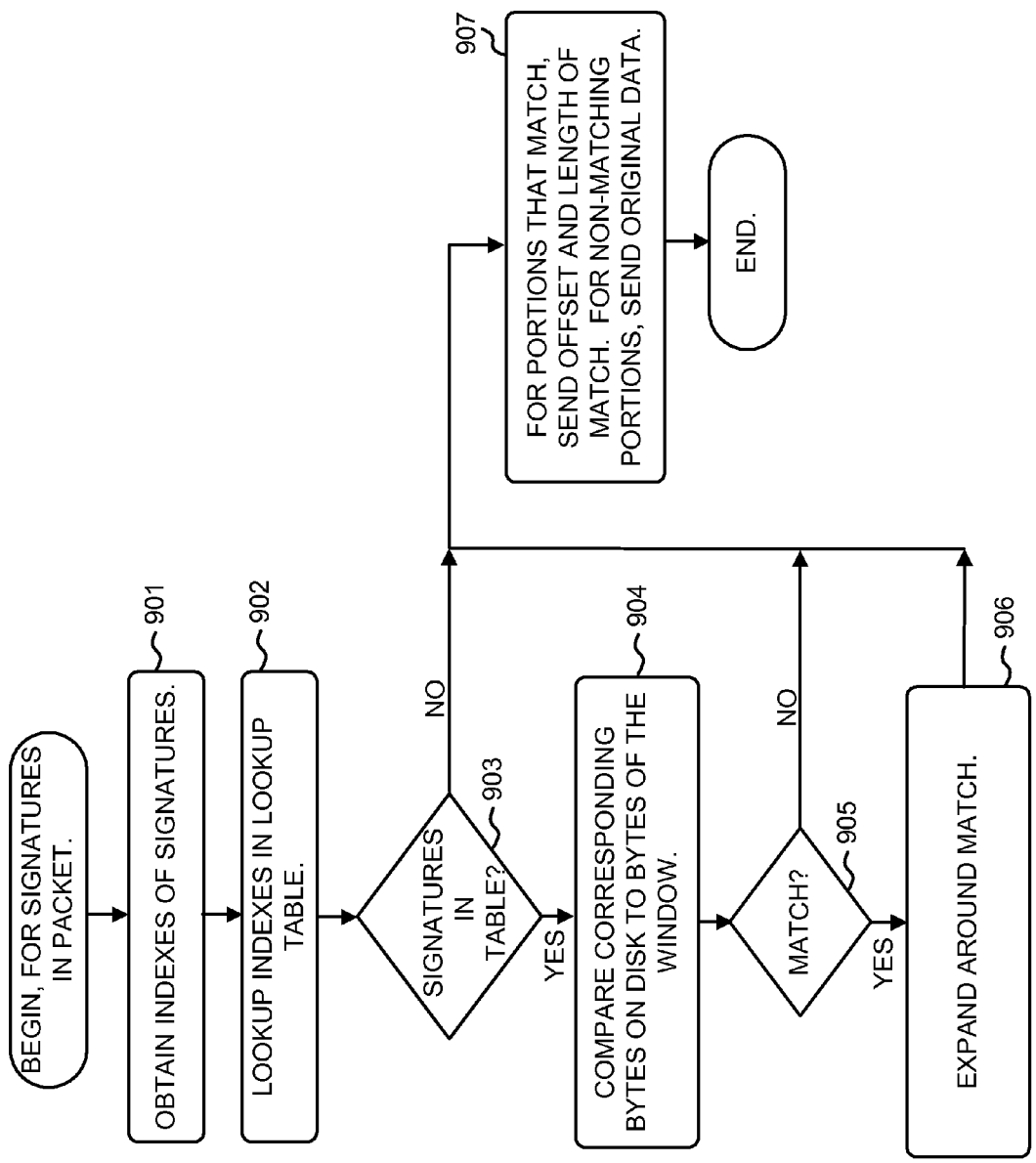
FIG. 9 is a flowchart illustrating exemplary operations for compressing data over a wide area network.

Compression component 420 may use lookup table 435 to compress data that is seen or received two or more times by compression component 420. FIG. 9 is a flowchart illustrating exemplary operations for compressing data. The operations of FIG. 9 may be performed by compression component 420 before sending the data to decompression component 430 of a corresponding network optimization device 150 on the opposite end of the WAN.

In the description that follows, assume that a particular packet, $P_m$, is received and that compression component 420 generates signatures $S_0, S_1, \ldots, S_p$ for the packet in acts 501, 502, 503, and 504 (FIG. 5).

For each of signatures $S_0, S_1, \ldots, S_p$, the corresponding index into lookup table 435 may be obtained (act 901). The index for each signature may be obtained using hashing function $F_h(S)$. Compression component 420 may then lookup the obtained indexes in lookup table 435 (act 902). That is, compression component 420 may iterate through the signatures in the chain corresponding to the index of the signature and compare each signature in the chain from lookup table 435 to the corresponding signature until it obtains a match or reaches the end of the chain. For signatures that were determined to match (act 903, YES), the data corresponding to the signature on hard disk drive 440 (i.e., the $L_d$ length window from hard drive 440) may be compared to the $L_d$-byte window of the input data to verify whether there is a match (act 904). When a match is detected (act 905, YES), compression component 420 may expand around the matching $L_d$-byte window to attempt to locate a larger matching chunk of data (act 906). For example, compression component 420 may determine that the entire length of input packet $P_m$ matches.

If there were any matching chunks of data in packet $P_m$, compression component 420 may send these chunks of the packet to decompression component 430 of the other network optimization device 150 as the offset values that identify the beginning of the chunks on hard drive 440 and the lengths of the chunk (act 907). The other network optimization device of a pair of network optimization devices stores data from the first network optimization device to its local hard disk drive using the same techniques used by the first network optimization device. Accordingly, with respect to the stored historical data, the two network optimization devices have identical disk contents. Thus, because the disk contents on the pair of cooperating network optimization devices are identical, decompression component 430 will be able to convert the offset values and lengths to the corresponding chunks of data on the disk. For portions of packet $P_m$ that were not matched in act 903 or 905, compression component 420 may send the original data (act 907).

Match expansion as performed in act 904 may not necessarily be limited to the boundaries of packet $P_m$. For example, if a signature match is expanded to the end of packet $P_m$, it may be likely that the sender is sending a data file that has been seen before. Therefore, when compression component 420 receives the next packet $P_{m+1}$, it may first try to continue the match after the end of packet $P_m$. For example, if the last byte of packet $P_m$ matches the byte at disk offset $O_k$, then compression component 420 may first compare the data in packet $P_{m+1}$ with the data on hard drive 440 starting at $O_{k+1}$. If there is a match for the whole packet $P_{m+1}$, then the match can be expanded again into the next packet $P_{m+2}$, and so on. If they do not match, compression component 420 may attempt to perform the signature-based match.

The techniques discussed above for compressing and sending data over a WAN may provide a number of advantages relative to existing techniques. For example, by using a full hash table to implement lookup table 435 instead of a one dimensional array, index collisions may be eliminated. By eliminating index collisions, the age of the stored data and the chance of finding a match may be independent.

Further, because only a limited number of signatures (e.g., one signature) is generated for each $L_n$ bytes written to disk drive 440, the size of lookup table 435 is limited to an upper bound based on the size of the history data that is stored and $L_n$. Accordingly, memory needed to store a particular lookup table can be easily determined and the size of the lookup table may be optimized for the available memory.

Since the techniques described above only replace signatures in lookup table 435 when data collisions occur, fewer signatures are lost than with the previous solutions. As a result, when a signature is found in lookup table 435, it is more likely that the corresponding offset actually corresponds to the correct data, i.e., the false positive rate of signature matches not corresponding to the underlying data can be greatly reduced.

CONCLUSION

A dictionary-based compression technique was described for optimizing the performance of WAN data transfer. The technique builds and uses an efficient index that is effective in locating matching historical data, which may be stored on high-capacity hard disk drives. The index can be relatively small, eliminates index collisions, and has a predictable maximum size for a given amount of stored data.

While a series of acts have been described with regard to FIGS. 5 and 9, the order of the acts may be varied in other implementations consistent with the invention. Moreover, non-dependent acts may be implemented in parallel.

It will also be apparent to one of ordinary skill in the art that aspects described herein may be implemented in many different forms of network topologies, software, firmware, and hardware in the implementations illustrated in the figures. The actual software code or specialized control hardware used to implement aspects described herein is not intended to limit the scope of the invention. Thus, the operation and behavior of the aspects were described without reference to the specific software code—it being understood that one of ordinary skill in the art would be able to design software and control hardware to implement the aspects based on the description herein.

Further, certain portions of the invention may be implemented as "logic" or as a "component" that performs one or more functions. This logic or component may include hardware, such as an application specific integrated circuit or a field programmable gate array, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A network device comprising:
a memory to store instructions; and
a processor to execute the instructions to:

maintain a lookup table that stores signatures that are used to determine when a block of data has been previously processed by the network device, and compress the block of data when the block of data has been previously processed and is being transmitted over a network, the lookup table including a hash table having a plurality of entries, each entry of the hash table corresponding to an index and including a signature for a block of data corresponding to the index and an offset pointing to the block of data corresponding to the index in a storage device.

2. The network device of claim 1, where the processor executes the instructions to further:
transmit the block of data over the network when the block of data has not been previously processed.

3. The network device of claim 1, where the processor executes the instructions to further:
generate the signatures that are included in the hash table using a hashing function.

4. The network device of claim 3, where the processor executes the instructions to further:
sample the generated signatures whose least significant bits include a particular value.

5. The network device of claim 1, where the index corresponds to a plurality of linked-list entries.

6. The network device of claim 1, where the network device includes a network optimization device to communicate with a second network optimization device over a wide area network.

7. The network device of claim 1, where the processor executes the instructions to further:
transmit the offset and a length of the block of data over the network when the block of data has been previously processed.

8. A method comprising:
generating a plurality of signatures for a block of data in a data stream;
selecting a signature from the generated plurality of signatures for the block of data;
matching the selected signature to signatures stored in a hash table, the matching including comparing the signature to a plurality of previously stored signatures in the hash table that corresponds to the generated signature;
matching the block of data to a previously stored block of data when a match of the signature is detected in the hash table; and
transmitting a reference to the block of data to a network device when the block of data is matched to the previously stored block of data.

9. The method of claim 8, further comprising:
expanding the block of data to obtain a larger block of matched data when the block of data is matched to the previously stored block of data.

10. The method of claim 8, where the reference to the block of data includes an offset and a length of the block of data.

11. The method of claim 8, further comprising:
transmitting the block of data to the network device when a match is not detected in the hash table or the block of data is not matched to a previously stored block of data.

12. The method of claim 8, further comprising:
generating the signature for each of a plurality of overlapping blocks of data.

13. The method of claim 8, where generating a plurality of signatures includes generating a signature for each first fixed length block of data of the data stream and where selecting the signature includes selecting the signature from the generated plurality of signatures for each second fixed length block of data, where the second fixed length block of data is larger than the first fixed length block of data.

14. The method of claim 8, further comprising:
generating the signatures that are stored in the hash table using a hashing function.

15. A system comprising:
a lookup table that stores signatures that are used to determine when a block of data has been previously processed by the network device; and
a processor to:
generate a signature for the block of data;
match the generated signature to signatures stored in the lookup table;
match the block of data to a previously stored block of data when a match of the signature is detected in the lookup table; and
transmit a reference to the block of data when a match is detected in the lookup table and the block of data is matched to the previously stored block of data.

16. The system of claim 15, where the lookup table includes a bucketed hash table.

17. The system of claim 15, where the processor is further to:
expand the block of data to obtain a larger block of matched data when the block of data is matched to the previously stored block of data.

18. The system of claim 15, where the reference to the block of data includes an offset and a length of the block of data.

19. The system of claim 15, where the processor is further to:
transmit the block of data when a match is not detected in the lookup table or the block of data is not matched to a previously stored block of data.

20. The system of claim 15, where, when generating the signature, the processor is further to:
generate the signature for each of a plurality of overlapping blocks of data, and where, when matching the generated signature, the processor is further to:
match each generated signature to signatures stored in the lookup table.

* * * * *